United States Patent [19]

Eichman et al.

[11] Patent Number: 5,348,587
[45] Date of Patent: Sep. 20, 1994

[54] APPARATUS FOR ELIMINATION OF LOW TEMPERATURE AMMONIA SALTS IN TICL4 NH3 CVD REACTION

[75] Inventors: Eric C. Eichman; Bruce A. Sommer, both of Phoenix; Michael J. Churley; W. Chuck Ramsey, both of Tempe, all of Ariz.

[73] Assignee: Materials Research Corporation, Orangeburg, N.Y.

[21] Appl. No.: 133,582

[22] Filed: Oct. 7, 1993

Related U.S. Application Data

[63] Continuation of Ser. No. 976,516, Nov. 16, 1992, Pat. No. 5,271,963.

[51] Int. Cl.$^5$ .............................................. C23C 16/50
[52] U.S. Cl. .................... 118/723 MP; 118/723 E; 118/725; 118/724; 156/345
[58] Field of Search ..... 118/723 E, 723 ER, 723 MP, 118/724, 725; 156/345

[56] References Cited

U.S. PATENT DOCUMENTS

| | | | |
|---|---|---|---|
| 3,906,892 | 9/1975 | Van Cakenberghe | 118/49.1 |
| 4,709,655 | 12/1987 | Van Mastrigt | 118/719 |
| 4,735,633 | 4/1988 | Chiu | 118/723 E X |
| 4,803,127 | 2/1989 | Hakim | 428/457 |
| 5,006,192 | 4/1991 | Deguchi | 156/345 |
| 5,044,314 | 9/1991 | McNeilly | 118/715 |
| 5,102,496 | 4/1992 | Savas | 156/345 X |
| 5,180,434 | 1/1993 | DiDio et al. | 118/723 E X |

OTHER PUBLICATIONS

Kurtz, S. R., "Chemical Vapor Deposition of Titanium Nitride at Low Temperatures", Dept. of Chemistry, Harvard Univ., Cambridge, MA, accepted Dec. 2, 1985.
Travis, E. O. et al., "Scalable Submicron Contact Technology Using Conformal LPCVD TiN", ICCC, 1990, IEDM 90-47.
Pintchovski, F. et al., "LPCVD Titanium Nitride-Deposition, Properties, and Application to ULSI", Materials Research Society, 1989, pp. 275-282.

*Primary Examiner*—Nam Nguyen
*Assistant Examiner*—Jonathan D. Baskin
*Attorney, Agent, or Firm*—Wood, Herron & Evans

[57] ABSTRACT

A cold wall CVD reactor, particularly one for use in depositing TiN in a $TiCl_4 + NH_3$ reaction, is provided with a metallic liner insert in partially thermally insulated from the reactor wall which serves as one plasma electrode to form a weak secondary plasma when energized along with a second electrode near the vacuum exhaust port of the reactor. The plasma, in cooperation with radiant lamps provided to heat a wafer substrate onto which the primary CVD film is to be applied, heats the liner and a portion of the space adjacent the reactor walls and susceptor surfaces downstream of the reaction volume to cause the formation of deposits to be of the nature that can be removed by plasma cleaning without opening the reactor volume. Deposits such as $TiN_xCl_y$ and TiN form at temperatures of approximately 200° C. to 650° C., preferably between 300° C. and 450° C., rather than adduct ammonia salts of $TiCl_4$, which would tend to form at temperatures of 200° C. or less.

8 Claims, 1 Drawing Sheet

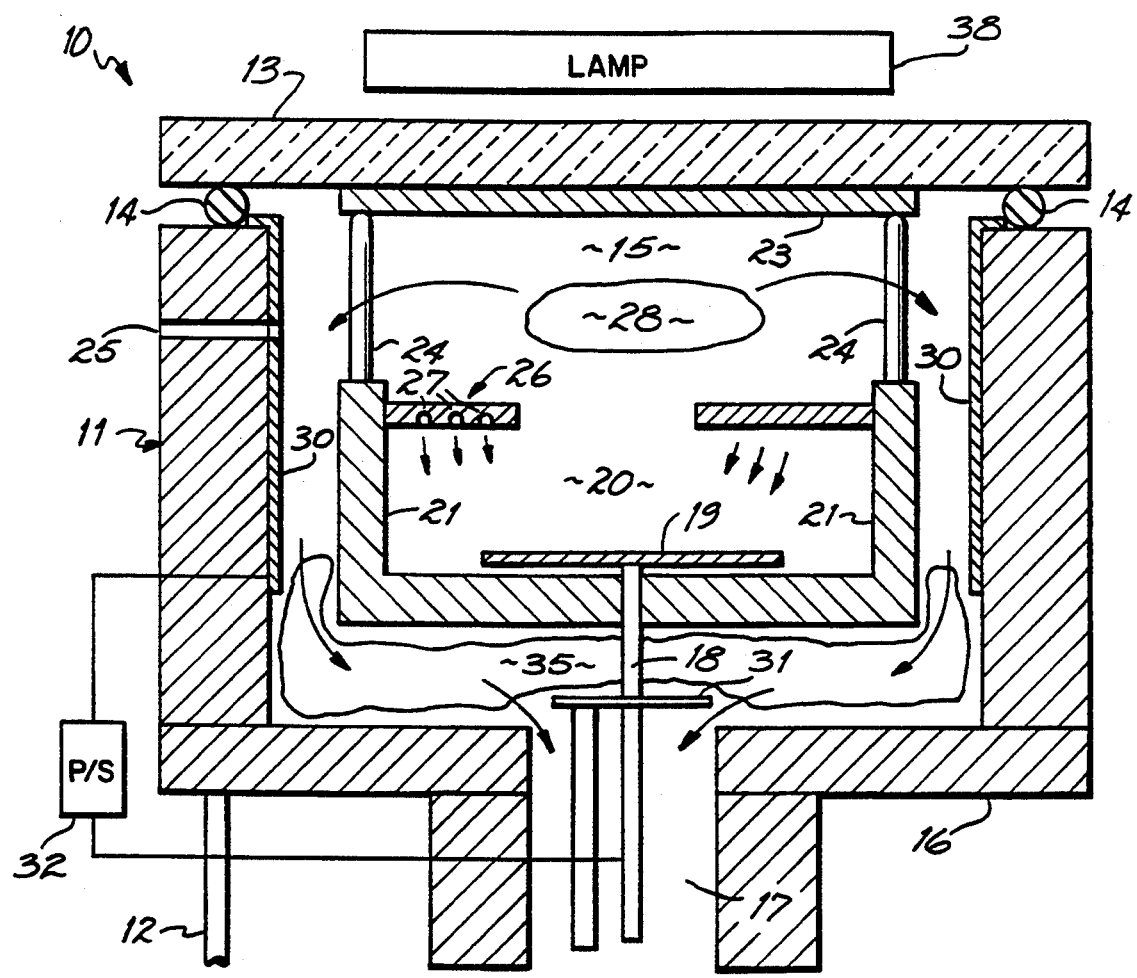

APPARATUS FOR ELIMINATION OF LOW TEMPERATURE AMMONIA SALTS IN TICL4 NH3 CVD REACTION

This application is a continuation, of application Ser. No. 07/976,516, filed Nov. 16, 1992, now U.S. Pat. No. 5,271,963.

The present invention relates to prevention of the formation of undesired deposits on internal components of CVD reactors, and more particularly, to CVD methods and CVD reactors adapted to prevent the formation of low temperature salts such as adduct salts of ammonia in reactions of titanium tetrachloride and ammonia to deposit titanium nitride films on substrates such as semiconductor wafers.

BACKGROUND OF THE INVENTION

In the manufacture of semiconductor devices, coating processes are performed in which films are deposited onto substrates such as silicon wafers by processes that frequently include chemical vapor deposition (CVD). These processes are usually performed in the sealed vacuum chambers of reactors into which reactant gases are introduced and reacted to produce a coating material that adheres to and produces a thin film on the substrate surface. Many of the reactions are carried out by elevating the surface of the wafer to a reaction temperature of the primary film producing reaction, and otherwise maintaining other parts of the reactor at a lower, near ambient temperature, which prevents the occurrence of the reaction and the deposition of the coating material other than on the surface of the substrate to be coated.

In the chemical vapor deposition of materials such as, for example, titanium nitride (TiN), reactions between the reactant gases may occur at temperatures below the reaction temperature of the substrate. Such reactions may produce reaction products that are of a composition other than that of the coating material deposited on the substrate. These materials often form deposits on components of the reactor. When such deposits form, they may interfere with the operation of the reactor or contaminate the substrates being processed. As a result, it is necessary to periodically clean the reactor of the undesired deposits. Such cleaning may involve the periodic introduction of a cleaning gas into the reactor, the cycling of the reactor through various temperature and pressure cycles, or the disassembly of the reactor to scrub the deposits from its internal components.

In titanium nitride CVD processes, for example, in which the primary reaction is that of titanium tetrachloride (TiCl4) with ammonia (NH3), the reaction

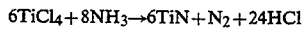

occurs at the surface of the substrate with the temperature of the substrate usually maintained in the range of from 300° C. to 650° C. In such a reaction, a gold colored TiN is deposited onto the heated surface of the substrate and the N2 and HCl reaction by-products, which are gases, are removed through the vacuum exhaust port of the reaction chamber.

In the TiCl4+NH3 process, the walls of the CVD reactors have been traditionally cooled to approximately ambient temperature, or to temperatures that are at least somewhat less than 200° C. to 250° C. Hot walls, or walls at the same temperature as the substrate, would cause rapid buildup of TiN on the reactor walls and the need to continuously clean the reactor, which could require the use of a nitrogen fluoride (NF3) plasma treatment and purging after the processing of nearly every wafer. At such near ambient temperatures, however, a portion of the reactant gases combine to form adduct salts of the reactants, such as white or yellow salts of TiCl4.NH3, on reactor walls and on other such cool surfaces. While the buildup of these salts is slower than that of TiN on surfaces at the primary reaction temperature, they cannot be removed with an NF3 plasma. Thus, the formation of the adduct salts requires periodic opening of the reactor and the cleaning of the reactor walls with water.

In the course of TiCl4+NH3 processes, substances such as $TiN_xCl_y$ compounds form blue and dark purple-blue films on certain internal reactor components that are at intermediate temperatures in the 300° C. to 450° C. range. These substances also require periodic cleaning of the reactor, but are removable with NF3 plasma.

The NF3 plasma cleaning of the reactor includes the formation of an NF3 plasma, with the reactor remaining sealed. Such a plasma dissolves the blue and dark blue deposits of $TiN_xCl_y$ and the gold TiN.

Because such an NF3 plasma treatment is not effective to remove the light colored, white or yellow, adduct ammonia salts of titanium tetrachloride and periodic opening of the reactor and a manual cleaning of the internal reactor parts is required, serious problems are caused by a shut down of the reactor, interruption of the vacuum by opening of the reactor, cleaning of the reactor's internal surfaces with water, and a resealing and repurging of the reactor. This cleaning process results in substantial down-time and a costly loss of through-put occurs. Where such a CVD reactor is only one of several processing modules of a multistep processing apparatus, such as a silicon wafer processing cluster tool, a substantial amount of productive use of expensive equipment is lost due to the need to clean one of the processing chambers. The opening of the reactor and the use of a water cleaning procedure tends also to increase particulate contamination that is present when the reactor is restarted. Accordingly, a need exists to minimize the need to clean CVD reactors, particularly those for TiN CVD processes, and to avoid the need to open the reactor when such cleaning becomes necessary.

SUMMARY OF THE INVENTION

It is a primary objective of the present invention to reduce the need for, and frequency of, cleaning a CVD reactor, particularly one such as is used for the coating of semiconductor wafers with films such as TiN. It is a more particular objective of the invention to reduce or eliminate the need to clean CVD reactors by opening the sealed reactor and using water for the cleaning of the reactor parts. Further objectives of the present invention are to reduce the down-time of a CVD reactor for the cleaning thereof and to reduce contamination resulting from unwanted deposits or reactor cleaning procedures.

It is a more particular objective of the present invention to reduce or prevent the formation of undesirable deposits, particularly those that cannot be removed from the reactor by in-situ vacuum procedures, during a chemical vapor deposition process. It is a specific objective of the present invention to reduce or prevent the formation of unwanted deposits such as those that form at temperatures below those of the primary CVD reaction, and more specifically to prevent the formation of low temperature adduct white and yellow ammonia salts of $TiCl_4$ in a $TiCl_4 + NH_3$ process for the deposition of TiN onto silicon semiconductor wafers.

In accordance with the preferred embodiment of the present invention, a cold wall CVD reactor adapted for the deposition of TiN or other film onto a heated silicon semiconductor wafer is provided with structure that facilitates the generation of a secondary plasma in the proximity of the walls or other surfaces onto which substances, such as for example adduct white and yellow ammonia salts $TiCl_4$, otherwise have a tendency to form. The secondary plasma elevates the temperature of such surfaces to above that at which such salts tend to form to a temperature at which any films that form are films, such as those of the blue and dark purple-blue colored salts, that are removable by in-situ vacuum cleaning procedures, such as the cleaning with an $NF_3$ plasma in the case of TiN deposition processes.

In accordance with the preferred and illustrated embodiment of the present invention, a surface liner is provided on the cold wall of a CVD reactor and partially thermally insulated therefrom. At least a portion of the liner is positioned downstream of the reaction volume in which the primary deposition reaction occurs, so as to cover the upstream portion of the internal surfaces of the reactor wall which partially spent gases from the reaction are likely to contact and on which the undesired deposits are likely to form. Downstream of these surfaces, a secondary electrode is located, and RF energy is applied between the secondary electrode and the liner. A low energy secondary plasma is thereby generated along the liner and between the liner and secondary electrode which warms the reactants to an elevated temperature above that at which the undesirable salts are produced. The electrode temperature is preferably still below that of the primary reaction, and is a temperature at which any deposits produced are those cleanable by in-situ procedures such as plasma cleaning of the sealed reactor.

In the preferred embodiment of the invention, the substrate is heated by radiant energy from lamps at the upstream end of the chamber, and the liner is positioned so as to be partially heated, particularly at the upstream end thereof, by energy from the lamps. In this way, the lamps cooperate with the secondary plasma to more uniformly maintain the liner at the elevated sub-reaction temperature.

With the present invention, for a TiN CVD reactor that uses a $TiCl_4 + NH_3$ reaction, the secondary plasma and other liner heating sources heat the liner to a temperature of from at least approximately 200° C. to not more than the main TiN reaction temperature of approximately 650° C. The preferred conditions for the primary reaction are a chamber pressure of about 150 mTorr, and flow rates of 10 sccm for $TiCl_4$, 100 sccm for $NH_3$ and 20–30 sccm for argon. Under these conditions, the wafer to be coated is preferably maintained at 450°–650° C. At such conditions, the liner is heated to over 200° C. and not over 650° C., preferably from 250° C. to 450° C., and most preferably between about 300° C. and 350° C. This causes either $TiN_xCl_y$ compounds, volatile compounds, minor amounts of TiN, or a combination thereof, to form instead of adduct $TiCl_4 \cdot NH_3$ salts, thereby producing only deposits on the reactor components that can be cleaned by an in-situ procedure such as with $NF_3$ plasma in the sealed vacuum of the reactor.

The heated liner feature of the present invention is particularly useful where design requirements and restrictions do not permit other effective external controlled heating of reactor walls and where existing cold wall reactors are retrofitted.

These and other objectives of the present invention will be more readily apparent from the following detailed description of the invention in which:

BRIEF DESCRIPTION OF THE DRAWING

FIG. 1 is an elevational diagram of a CVD reactor constructed and operated in accordance with the principles of the present invention.

DETAILED DESCRIPTION OF THE DRAWING

Referring to FIG. 1, a CVD reactor 10 embodying principles of the present invention is diagrammatically illustrated. The reactor 10 includes a cylindrical reactor wall 11 provided with cooling fluid ducts (not shown) therein, which connect to a recirculating supply of cooling water 12. The wall 11 has an open top, which is covered by a quartz window 13. The window 13 is sealed to the top rim of the wall 11 by a seal 14 to enclose a pressure tight reaction chamber 15 therein.

The wall 11 includes a circular bottom surface 16 having an opening 17 at the center thereof through which is connected a vacuum pump (not shown) to evacuate the chamber 15 to a vacuum pressure level for performance of a vacuum CVD process within the chamber 15. Positioned through the opening 17 is a support 18 on which is mounted a gas inlet chamber 20. The support 18 also houses a conductor connected to a primary electrode 19 for use in plasma CVD processes.

The gas inlet chamber 20 includes a cylindrical wall 21 that is closed at its bottom and open at its top. Within the wall 21, are mounted a plurality of vertically moveable lift pins 24 which raise and lower, through a lift mechanism (not shown), a wafer 23 through a gate 25 in the chamber wall 11 and hold it against the bottom of the window 13 in a downwardly facing orientation for processing on its downwardly facing side.

Near the top of the wall 21 is mounted a gas distribution baffle assembly 26 having a plurality of gas inlet holes 27 therein oriented to discharge gas downwardly into the chamber 20 within the wall 21. The holes 27 communicate through ducts (not shown) in the baffle 26 and wall 21, through the support 18 to supplies of gases (not shown) that include reactant gases for the CVD reaction. For TiN CVD processes, the gas supplies include supplies of $TiCl_4$ gas and $NH_3$ gas for the primary reaction and a supply of inert argon gas. In addition, the supplies also include a supply of cleaning gas, such as $NF_3$, which is selectively connectable to the holes for use in a plasma cleaning procedure.

On the inner surface of the reactor wall 11 is snugly fit a thin conductive liner 30, preferably formed of nickel alloy such as Ni200 or other moderately thermally and electrically conductive metallic material. The liner 30 extends from near the top of the wall 11, preferably to about 0.0010" from the O-Ring seal 14, to a distance near the bottom of the wall 21. This spacing avoids a cold space on the wall 11 above the liner without excessively heating the seal 14. The liner 30, while lying against the inner surface of the reactor wall 11, is not in intimate contact with it over its entire area, so that, in the vacuum environment of the reaction chamber 15, the liner 30 is at least partially thermally insulated from the reactor wall 11.

Below the bottom of the chamber 20, mounted on the support 18 at the inlet of the opening 17, is a secondary electrode 31, preferably of the same material as the liner. An RF power supply 32 is connected between the electrode 31 and the liner 30 to impose electrical energy at a frequency and power level sufficient to ionize reactant gases passing therebetween to produce a plasma 35 that is just strong enough to warm at least the lower portion of the liner 30 and the walls 11 adjacent the plasma 35 to an elevated temperature. The warming of the liner 30 is to a temperature preferably below the reaction temperature of the main CVD process by which the TiN film is to be deposited on the wafer 23. The power supply may be, for example, 200 watts with a frequency of 13.56 mHz. The plasma so produced is that which will be sufficient to warm at least the lower portion of the liner 30 and the walls 11 adjacent the plasma 35 to an elevated temperature, but to a temperature preferably below the reaction temperature of the main CVD process by which the TiN film is to be deposited on the wafer 23. Improvement results at temperatures of from 200° C. to 650° C., but most notably between 250° to 450° C. The preferred range is 300° C. to 350° C.

The wafer 23, mounted against the window 13, is maintained at a primary reaction temperature by radiant lamps 38 mounted outside of the chamber 15 above the window 13.

In TiN film deposition processes, the temperature of the wafer 23 is preferably about 650° C. The reactor walls 11 are usually cooled to a temperature below 200° C., often close to ambient temperature which may be substantially below 100° C. For TiN CVD, reactant gases introduced through the holes 27 that include TiCl4 and NH3 circulate within the mixing chamber 20 and flow from there up into a reaction volume 28 across the surface of the wafer 23. When heated to reaction temperature of from approximately 450° C. to approximately 650° C., the reaction:

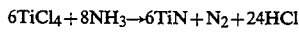

$$6TiCl_4 + 8NH_3 \rightarrow 6TiN + N_2 + 24HCl$$

proceeds, depositing a film of TiN on the wafer 23. Gases from the reaction volume 28 then flow through the space 15 between the wall 21 and the liner 30, along the surface of the chamber wall 11 beneath, and out through the exhaust port 17. In the TiN deposition reaction, these gases include the reaction by-products $N_2$ and HCl, as well as unspent $TiCl_4$ and $NH_3$. Frequently, only a small percentage of the $TiCl_4$ is consumed in the reaction volume 28, with as much as 99 percent of it flowing downstream to the exhaust port.

Flowing downstream from the reaction volume 28, the gases tend to further react, forming deposits of $TiN_xCl_y$, with some TiN, on the baffle 26 and other reactor components that are at or above a temperature of 250° C. These gases would also form white or yellow adduct $TiCl_4.NH_3$ salts on surfaces that are at temperatures below 200° C. or 250° C.

With the present invention, RF electrical energy at, for example 13.56 mHz, is applied between the electrode 31 and the liner 30 and adjusted to a level that will cause ionization of the gases flowing downstream of the reaction volume 28 toward the port 17 and to form a plasma that will raise the temperature of the reactor surfaces adjacent the plasma 35 to at least 200° C. or preferably to the higher temperatures discussed above, but preferably below 650° C. In addition, the upper portion of the liner 30 is heated by some of the energy from the heat lamps 38 behind the window 13 to about the same temperature as caused by the plasma on the lower portion of the liner 30. This cooperation of the lamps 38 in the heating of the liner 30 helps avoid interference of the secondary plasma with the primary reaction or content of the plasma with the substrate.

As a result of the generation of the plasma 35 and the provision of the heated liner 30, the temperature of secondary reactions in the gases downstream of the main CVD reaction are such that only deposits of tolerable materials, such as blue and purple-blue salts of titanium, are formed on reactor surfaces. With TiN CVD processes, the low temperature white and yellow adduct $TiCl_4.NH_3$ salts do not form, but rather the downstream deposits include TiN and $TiN_xCl_y$. The formed deposits are then removed by operating the reactor 10 without a wafer 23 therein, and with $NF_3$ gas substituted for the reactant gases introduced through the holes 27. The $NF_3$ gas is energized to form a plasma by which the deposits can be removed with the reactor 10 maintained in a sealed condition and a vacuum pressure maintained in the chamber 15.

As a result, the production of contaminants within the chamber 15 during processing, and the introduction of contaminants into the chamber 15 during cleaning, are reduced, and substantial non-productive down-time for the reactor 10 is avoided.

The above description is of one preferred embodiment of the invention. Those skilled in the art will appreciate that modifications of the above and additions thereto may be made without departing from the principles of the invention.

Accordingly, the following is claimed:

1. An apparatus for processing semiconductor wafers comprising:
   a CVD reaction chamber bounded by a sealable cold wall and having a wafer supporting susceptor contained therein, a heater positioned to heat a wafer supported on the susceptor to a primary reaction temperature, a reaction gas inlet, and a gas outlet, the susceptor, inlet and outlet being positioned such that reaction gases from the inlet flow in a path from the inlet, against the susceptor, and downstream to the outlet;
   a surface liner on the cold wall partially thermally insulated therefrom, along the path downstream from the susceptor, on internal surfaces of the chamber where undesirable particulate contaminants tend to form when unspent reaction gases contact the cold reactor wall;
   a secondary electrode in the path downstream of the susceptor;
   an electrical potential source, connected to the secondary electrode, sufficient to form a low energy plasma in gas between the secondary electrode and at least a portion of the reactor surfaces that are in contact with gases flowing downstream of the susceptor to raise the temperature of gas downstream of the susceptor to a temperature above that at which undesirable contaminants will form but below the primary reaction temperature.

2. The apparatus of method of claim 1 wherein:
   the surface liner is a thin metal insert partially thermally insulated from the cold wall by its limited contact therewith and by the maintenance of the vacuum pressure level within the reactor.

3. The apparatus of claim 1 wherein:
the liner is at least in part in contact with the low energy plasma so as to be heated thereby to a temperature above that at which the undesirable contaminants will form but below the primary reaction temperature.

4. The apparatus of claim 1 wherein:
the heater includes a source of radiant heat in the vicinity of the susceptor directed to heat a wafer thereon to the primary reaction temperature; and
the liner being positioned with respect to the source of radiant heat so as to be at least partially heated by radiant heat therefrom to a temperature above that at which the undesirable contaminants will form but below the primary reaction temperature.

5. The apparatus of claim 1 further comprising:
means for supplying $TiCl_4$ and $NH_3$ reaction gases to the inlet;
means for controlling the heater, pressure within the chamber, and the reaction gas flow to cause the chemical vapor deposition of TiN on a wafer supported on the susceptor by the reaction of $$6TiCl_4 + 8NH_3 \rightarrow 6TiN + N_2 + 24\ HCl;$$

and
the electrical potential source being operative to form the low energy plasma such that the temperature of the gas downstream of the reaction volume is raised to a temperature of at least approximately 200° C. but the temperature of the wafer.

6. The apparatus of claim 5 wherein:
the liner is at least in part in contact with the low energy plasma and thereby heated to at least approximately 250° C. but not more than approximately 450° C.

7. The apparatus of claim 5 wherein:
the heater includes a source of radiant heat in the vicinity of the susceptor directed to heat a wafer thereon to the primary reaction temperature; and
the liner is positioned with respect to the source so as to be at least partially heated by radiant heat therefrom to a temperature above approximately 200° C.

8. The apparatus of claim 5 further comprising:
a $NF_3$ plasma generator connected to the reactor and operable to clean the reactor with an $NF_3$ plasma while the reactor is sealed.

* * * * *